(12) United States Patent
Okada et al.

(10) Patent No.: US 6,984,456 B2
(45) Date of Patent: Jan. 10, 2006

(54) FLEXIBLE PRINTED WIRING BOARD FOR CHIP-ON FLEXIBLES

(75) Inventors: Kazuyuki Okada, Ageo (JP); Yasuji Hara, Ageo (JP); Akira Uchiyama, Ageo (JP); Masaru Takahashi, Ageo (JP)

(73) Assignee: Mitsui Mining & Smelting Co., Ltd., Tokyo (JP)

(*) Notice: Subject to any disclaimer, the term of this patent is extended or adjusted under 35 U.S.C. 154(b) by 2 days.

(21) Appl. No.: 10/483,678

(22) PCT Filed: May 12, 2003

(86) PCT No.: PCT/JP03/05891

§ 371 (c)(1),
(2), (4) Date: Jan. 13, 2004

(87) PCT Pub. No.: WO03/096776

PCT Pub. Date: Nov. 20, 2003

(65) Prior Publication Data

US 2004/0163842 A1    Aug. 26, 2004

(30) Foreign Application Priority Data

May 13, 2002    (JP) .............................. 2002-136745

(51) Int. Cl.
B21D 39/00    (2006.01)

(52) U.S. Cl. ...................... 428/621; 428/612; 428/618; 428/626; 428/658; 428/674; 428/687; 428/344; 428/353; 156/150; 156/242; 156/325

(58) Field of Classification Search ................ 428/209, 428/901, 612, 618–626, 658, 674, 687, 344, 428/353; 156/150, 242, 325
See application file for complete search history.

(56) References Cited

U.S. PATENT DOCUMENTS

| | | | | |
|---|---|---|---|---|
| 4,455,181 A | * | 6/1984 | Lifshin et al. | 156/150 |
| 4,863,808 A | * | 9/1989 | Sallo | 428/601 |
| 5,017,271 A | * | 5/1991 | Whewell et al. | 205/125 |
| 5,833,819 A | | 11/1998 | Ohara et al. | |
| 5,863,666 A | * | 1/1999 | Merchant et al. | 428/544 |

FOREIGN PATENT DOCUMENTS

| | | |
|---|---|---|
| JP | 7-231161 A | 8/1995 |
| JP | 2000-269637 A | 9/2000 |
| JP | 2003-23046 A | 1/2003 |

* cited by examiner

Primary Examiner—Cathy F. Lam
(74) Attorney, Agent, or Firm—Rothwell, Figg, Ernst & Manbeck, P.C.

(57) ABSTRACT

There is provided a flexible printed wiring board including an insulating layer having a high optical transmittance, a high adhesion strength and a high migration resistance, and suitable for a chip on film (hereafter referred to as COF). In a flexible printed wiring board for COF, having an insulating layer on which a conductive layer of an electrodeposited copper foil is laminated, and an optical transmittance of 50% or more of the insulating layer in the etched region when a circuit is formed by etching said conductive layer, electrodeposited copper foil was made to have a rust-proofing layer of a nickel-zinc alloy on the adhering surface to be adhered to the insulating layer; the surface roughness (Rz) of the adhering surface was made to be 0.05 to 1.5 μm, and the specular gloss was made to be 250 or more when the incident angle is 60°.

4 Claims, 3 Drawing Sheets

(a)

(b)

FLEXIBLE PRINTED WIRING BOARD FOR CHIP-ON FLEXIBLES

CROSS REFERENCE TO RELATED APPLICATION

This application is a 35 USC § 371 National Phase Entry Application from PCT/JP03/05891, filed May 12, 2003, and designating the U.S.

TECHNICAL FIELD

The present invention relates to a flexible printed wiring board, and specifically to a flexible printed wiring board suitable for a chip-on-film type.

BACKGROUND ART

In recent years, accompanying the progress of the electronic device industry, demands for flexible printed wiring boards for mounting electronic parts such as ICs and LSIs have rapidly increased. Thus, the down sizing, that is, the size and weight reduction, and functional enhancement of electronic devices themselves have markedly progressed. For this purpose, packaging systems using flexible film carrier tapes, such as TAB (tape automated bonding) tapes, T-BGA (ball grid array) tapes, and ASIC (application specific integrated circuit) tapes, have been adopted. Particularly, in electronic devices having Liquid crystal displays, such as personal computers and mobile telephones, the progress toward high precision and thickness reduction is sharp, and flexible printed wiring boards having fine-pitch circuits formed thereon, which has not been realized conventionally, have been demanded; furthermore, there is an urgent need for the establishment of a method for mounting ICs and the like thereon.

In order to satisfy the demand for downsizing of electronic devices as described above, the technique for enabling ICs and the like to be mounted in narrow spaces is required. The techniques recently attracting attention include a packaging system known as chip on film (hereafter abbreviated as COF). In COF, a laminate of a copper foil (conductive layer), which is a conductive material forming a conductive circuit, and a film consisting of an insulating material such as polyimide (insulating layer)) is used; and the laminated film (hereafter referred to as flexible laminated board) is subjected to etching treatment to form a conductive circuit to be a flexible printed wiring board, whereon IC chips are directly mounted to perform packaging (COF).

A flexible printed wiring board used in the COF has no device holes as in a conventional TAB tape, and no inner leads corresponding to the conductive circuit portion not supported by the film exist. Namely, since the conductive circuit (even if it is an inner lead) is always in the state supported by the film, the line space of the conductive circuit corresponding to the inner lead of the TAB tape can be made further finer. The reason is that since the film is supported, the strength of the conductive circuit required during bonding can be secured even if the conductive circuit is made finer.

Since the flexible printed wiring board for COF has no device holes, the alignment in mounting IC or the like is performed by radiating light onto the conductive circuit pattern from one direction, confirming the transmitted light of the film on the opposite side, and directly recognizing the conductive circuit pattern shape. Since the alignment method using transmitted light can be applied to conventionally employed mounting machines for TAB tapes, the use of expensive equipment such as a chip bonder exclusively used in COF is not required, and the method tends to be widely adopted. For these reasons, a flexible printed wiring board for COF is required to have optical transmittance of the degree to exactly recognize alignment patterns.

As a flexible printed wiring board used for COF, a two-layer type board is known as obtained using a method wherein a seed layer of a metal such as nickel is formed on the surface of the film of a polyimide resin or the like (insulating layer), and copper to be a conductor is plated on the metal seed layer. In the flexible printed wiring board obtained using this method, known as a direct metallization method, since the insulating layer constituted by a polyimide resin or the like is formed in a relatively transparent state and has a high light transmittance, alignment for IC mounting can easily be performed; however, it has been pointed out that the adhesion between the formed conductor circuit and the insulating layer (peel strength) is low, and tends to cause migration.

In addition, it has been known that other flexible printed wiring boards can be manufactured using a casting method wherein a polyimide resin or the like as an insulating layer is applied to the surface of a conductor such as copper foil; or the most popular lamination method wherein a copper foil is bonded on such a film as a polyimide resin as the conductive layer for forming the conductive circuit. The flexible printed wiring board obtained using these casting method or lamination method excels in adhesion between the insulating layer and the conductive layer, and has high migration resistance compared with the direct metallization method. However, since the insulating layer on the portion from which the copper foil, i.e., the conductive layer, was etched off became the replica of the adhering surface of the copper foil, it tended to scatter light, and there might be the case where alignment using transmitted light could not be performed in IC mounting.

Therefore, it is the current status that when a flexible printed wiring board produced by the casting method or lamination method is used for COF, alignment holes must be separately formed in the insulating layer such as a polyimide resin by laser processing or the like in addition to the etching treatment for forming the conductive circuit.

To solve such problems, the present applicant has proposed a laminated film and a film carrier tape suitable for COF applications (e.g., refer to Patent Reference 1, Japanese Patent Laid-Open No.2003-23046). This laminated film has a structure wherein a conductive layer and an insulating layer are laminated, and is characterized in that the optical transmittance of the insulating layer in the region from which the conductive layer has been etched off is 50% or more. In addition, the copper foil for forming the conductive layer has produced a laminated film having a high optical transmittance by setting the surface roughness of the adhering surface thereof at 0.1 to 1.8 μm. Such a laminated film and film carrier tape can perform a good alignment in mounting ICs and the like.

However, when a copper foil having a reduced surface roughness of the adhering surface is used, the adhesion between the conductive layer and the insulating layer, that is, the lowering of the peel strength of the conductive circuit, cannot be avoided, and the laminated film having a desired peel strength must be manufactured after various examinations, such as the type of the resin constituting the insulating layer, and the surface treatment method including surface roughness on the adhering surface of the copper foil. Although the optical transmittance of the laminated film can be controlled to some extent by controlling the surface roughness on the adhering surface of the copper foil, it is the present situation that there are no findings on parameters for quality control of the adhering surface of the electrodeposited copper foil in order to realize the laminated film having a predetermined optical transmittance and a good adhesion, and the early clarification is required.

The present invention is devised in the above-described situations, and the object of the present invention is to provide a flexible printed wiring board suitable for COF that realizes a high optical transmittance of the insulating layer on the constitution of the flexible printed wiring board, and excels in the adhesion between the conductive layer and the insulating layer, and migration resistance.

DISCLOSURE OF THE INVENTION

As described above, when a conductive layer is laid on an insulating layer by the casting method or the lamination method, and etching is performed for forming a conductive circuit, the surface shape of the portion of the insulating layer from which an electrodeposited copper foil, which is a conductive layer, was etched off becomes, the replica of the adhering surface of the copper foil. In other words, if the surface of the copper foil adhered to the insulating layer is flat, the surface of the film, which is the replica thereof, is also in a flat state. However, on the contrary, a reciprocal action to lower the adhesion strength occurs. Therefore, the present inventors devoted themselves in the examinations on the characteristics of the adhering surfaces of electrodeposited copper foils, that is, the surface roughness and the rust proofing treatment thereof, and the optical transmittance and the adhesion strength of the insulating layer constituting a flexible printed wiring board, and devised the present invention.

The present invention is a flexible printed wiring board for COF, having an insulating layer on which a conductive layer of an electrodeposited copper foil is laminated, and an optical transmittance of the insulating layer in the etched region when a circuit is formed by etching the conductive layers of 50% or more, characterized in that the electrodeposited copper foil includes a rust-proofing layer of a nickel-zinc alloy on the adhering surface to be adhered to the insulating layer; and the surface roughness (Rz) of the adhering surface is 0.05 to 1.5 $\mu$m, and the specular gloss when the incident angle is 60° is 250 or more.

In most cases, the surface shape of an electrodeposited copper foil is specified using the surface roughness value thereof, and in general, if the surface roughness value is small, the surface is flat, and the large value is used to indicate a rough surface. Although the surface roughness value is important as a parameter to indicate the surface shape, it is the average of values representing the irregularity on the surface shape. Therefore, it could not be said to be sufficient to identify the surface shape affecting the scattering of light. In other words, even if the measured value of surface roughness was small, there was an insulating layer that became the surface state having not so high optical transmittance. Therefore, the present inventors measured the specular gloss of the adhering surfaces of copper foils to identify the surface shape, and found that the specular gloss of the adhering surfaces had correlation with the optical transmittance of the insulating layer after etching.

Furthermore, the present inventors conducted various examinations on the surface treatments thereof, particularly on rust proofing treatment, in order to make adhesion with the insulating layer excellent even if the roughness is very low as in the electrodeposited copper foil used in the flexible printed wiring board of the present invention, and made the adhering surface of the electrodeposited copper foil be provided with a rust proofing layer of a nickel-zinc alloy.

The flexible printed wiring board according to the present invention has the optical transmittance of the insulating layer after the etching treatment of the conductive layer is 50% or more, and the adhesion strength between the formed conductive circuit and the insulating layer has practically no problem. Thus, the formation of a very fine conductor that excels in migration resistance is enabled.

Although it cannot be said that distinct standards exist for the optical transmittance of flexible printed wiring boards for COF, from the conventional experiences, the transmittance is measured by transmitting visible light, that is light having a wavelength of 400 to 800 nm or so as a light source. Since some materials of the insulating layer, that is the film significantly absorbs the wavelength of 500 nm or below, generally, the light source of the wavelength range between 600 and 700 nm is used. This wavelength range is a light source used in the image processing by a so-called CCD camera or the like, and it is considered that if the optical transmittance in this wavelength range is about 50% or. more, alignment can be easily and surely performed. In other words, the flexible printed wiring board according to the present invention can make the optical transmittance of the insulating layer after etching the electrodeposited copper foil 50% or more in a range of wavelengths between 600 and 700 nm, even if there is some difference in the material or the like of the insulating layer, and therefore alignment in mounting ICs can be surely performed.

In the case of a flexible printed wiring board that can realize such a high optical transmittance, it is required to make the surface roughness of the adhering surface of the electrodeposited copper foil Rz 0.05 to 1.5 $\mu$m, and make the specular gloss (incident angle: 60°) 250 or more. As described above, even if the surface roughness is small to some extent, there may be the case where a practical optical transmittance cannot be secured. Therefore, based on the results of the present inventors' examinations, it was concluded that the surface roughness of the adhering surface of the electrodeposited copper foil was 1.5 $\mu$m or below in Rz, and the specular gloss at an incident angle of 60° was 250 or more. Although the flexible printed wiring board of the present invention can be constituted even if the surface roughness Rz is less than 0.05 $\mu$m, considering the difficulty of manufacturing an electrodeposited copper foil having an ultra-low roughness of less than Rz 0.05 $\mu$m, this lower limit was determined. This difficulty is a problem in the manufacturing technique, for example, in manufacturing an electrodeposited copper foil of ultra-low roughness, since the surface of the rotating drum cathode used for manufacturing thereof is made extremely smooth, the electrodeposited copper foil deposited on the cathode in the electrolyte solution is easily detached from the cathode surface, and the detached electrodeposited copper foil contacts the anode to make a short circuit.

It is also desired that the specular gloss of the adhering surface of the electrodeposited copper foil of the flexible printed wiring board according to the present invention at an incident angle of 20° is 100 or more. Since the specular gloss at an incident angle of 60° is the value most widely used as the measurement range of a gloss meter, it was adopted. Furthermore, the present inventors examined the specular gloss for various incident angles in accordance with JIS Standards (JIS Z 8741), and decided that the high optical transmittance, which is the object of the present invention, could be realized when the specular gloss is 100 or more, as a result of the measurement of the adhering surface of the electrodeposited copper foil at an incident angle of 20° in the case of a high specular gloss (specular gloss is 70 or more at an incident angle of 60°).

Furthermore, in order to provide the electrodeposited copper foil for the flexible printed wiring board according to the present invention with a good adhesion while realizing a high optical transmittance, a rust proofing layer of a nickel-zinc alloy is formed on the surface where the electrodeposited copper foil attaches without performing nodular treatment. The nickel-zinc alloy in this case has preferably the composition of 50 to 99 wt % nickel and 50 to 1 wt % zinc. This rust proofing layer plays a role of preventing the surface oxidation of the electrodeposited copper foil itself, as well as improving the adhesion strength between the adhering surface and the insulating layer, and migration resistance properties. In a flexible printed wiring board for COF, polyimide, polyester, polyamide, polyether sulfone, liquid-crystal polymers and the like are used as insulating material, and all aromatic polyimide is most preferable. The nickel-zinc alloy is effective for improving adhesion to these insulating materials. Especially, nickel tends to improve the adhesion to polyimide-based insulating materials. If the content of nickel is less than 50 wt %, the improvement of adhesion cannot be secured, and if the content of nickel exceed 99 wt %, nickel remains easily when etching treatment is performed. If the content of zinc is less than 1%, copper tends to diffuse into the insulating layer side due to thermal history produced in manufacturing the flexible printed wiring board (by the casting method or the lamination method), and as a result, the adhesion strength cannot be secured. If the content of zinc exceeds 50%, corrosion resistance to an Sn plating solution used in the manufacture of the flexible printed wiring board, and detachment of the conductive circuit tends to occur.

In the rust proofing treatment of the electrodeposited copper foil of the flexible printed wiring board according to the present invention, it is practically preferable that the quantity of the nickel-zinc alloy applied to the adhering surface is 20 to 100 mg/m$^2$. If the quantity is less than 20 mg/m$^2$, the adhesion strength cannot be secured, and if the quantity exceeds 100 mg/m$^2$, there is the tendency of causing etching residue during etching for forming the conductive circuit. Furthermore, when the rust proofing treatment is performed using this nickel-zinc alloy, the quantity ratio of nickel and zinc is preferably within a range between 4:1 and 7:3. If the proportion of nickel in the nickel-zinc alloy exceeds 80%, etching residue tends to occur. If the proportion of zinc exceeds 30%, the adhesion strength tends to lower.

The rust proofing layer is composed of a nickel-zinc alloy layer whereon a chromate layer is formed, and it is preferable to form a silane coupling agent adsorbed layer whereon an amino functional silane coupling agent is adsorbed is formed on the surface of the rust proofing layer. The chromate layer and the silane coupling agent adsorbed layer further improve the adhesion to the insulating layer, and can also improve moisture resistance and chemical resistance.

The kind of the silane coupling agents is not limited, and for example, vinyltrimethoxysilane, vinylphenyltrimethoxysilane, γ-methacryloxypropyltrimethoxysilane, γ-glycidoxypropyltrimethoxysilane, 4-glycidylbutyltrimethoxysilane, imidazolsilane, triazinesilane, and γ-mercaptopropyltriiethoxysilane can be used. Also according to the present inventors' examinations, amino-functional silanes are confirmed to be especially preferable in polyimide-based insulating materials. For example, amino-functional silanes include γ-aminopropyltriethoxysilane, N-β(aminoethyl)γ-aminopropyltrimethoxysilane, and N-3-(4-(3-aminopropoxy)butoxy)propyl-3-aminopropyltrimethoxysilane.

As described above, in the flexible printed wiring board according to the present invention, although a polyimide-based resin is often used as the insulating layer, the adhesion between the insulating layer composed of such a polyimide-based resin and the electrodeposited copper foil is not so good, and it is said that the adhesion strength (peeling strength) is difficult to secure. In particular, when an electrodeposited copper foil is directly adhered to a film or a base material consisting of a polyimide-based resin without using an adhesive or the like, the adhesion is much worsened. However, when the rust proofing layer is formed of a nickel-zinc alloy, and an amino functional silane coupling agent adsorbed layer is further formed, the adhesion strength to the insulating layer consisting of a polyimide-based resin can be maintained at a certain level.

When a resin agent is applied, for example, as a cast solution on the surface of an electrodeposited copper foil to form an insulating layer of a polyimide-based resin, the use of the above-described amino-functional silane as silane coupling agent can further improve the adhesion. The present inventors may explain the result as follows: Captone, a typical polyimide, forms polyamic acid through the reaction of an acid anhydride with a diamine, and dehydration between the NH group and the OH radical of the COOH group in the polyamic acid closes the imide ring to form eventually polyimide. Here, it is considered that in the flexible printed wiring board according to the present invention, when the adhering surface of the electrodeposited copper foil has the amino functional silane, the OH of the polyamic acid chemically bonds to H of the hydrolysis product of the amino functional silane through a dehydration reaction, and excellent adhesion strength is realized.

In the flexible printed wiring board according to the present invention as described above, it is preferable to use the shiny side of the electrodeposited copper foil as the adhering surface thereof. According to the present inventors' examinations, it was confirmed that the optical transmittance of the insulating layer lowered even if the adhering surface had a surface roughness value of less than Rz 2 μm. The flexible printed wiring board of the present invention is formed using an electrodeposited copper foil, and the electrodeposited copper foil is normally manufactured by immersing a-rotating drum cathode in a copper sulfate electrolytic solution to electrodeposit copper on the peripheral surface of the rotating drum cathode through the electrolysis reaction, and continuously peeling the electrodeposited copper from the peripheral surface. In this electrodeposited copper foil, the surface of the side of initial electrodeposition, that is, the side whereon electrodeposition onto the peripheral surface of the rotating drum cathode started, is called the shiny side; and the opposite electrolysis completing side is called the matte side for distinguishing. In other words, the shiny side is the flat surface to be the transferring shape of the electrodeposited surface of the rotating drum cathode; and the matte side is the "delustered" surface having irregularity. A copper foil called an LP foil (low profile copper foil) is an electrodeposited copper foil controlled to have a considerably low surface roughness value on the matte side, and the matte side has usually little gloss. In thus obtained electrodeposited copper foil, considering the adhesion strength to prepreg or the like composing so-called rigid printed wiring board, a roughened treatment called nodular treatment is generally performed on the matte side that becomes the adhering surface to the prepreg. When such a roughened treatment is performed, the glossiness of the surface thereof further lowers, and naturally, when the surface of such a low glossiness is used as the adhering surface, the optical transmittance of the insulating layer is almost always worsened.

Therefore, the present inventors have tested a number of methods for manufacturing an electrodeposited copper foil used in the flexible printed wiring board according to the present invention, and have found that the following manufacturing method is preferred: As the method for manufacturing an electrodeposited copper foil used in the flexible printed wiring board according to the present invention, the peripheral surface of a rotating drum cathode is polished until it has a surface roughness of 0.05 to 1.5 μm (Rz); the rotating drum cathode is immersed in a copper sulfate electrolytic solution to electrodeposit copper on the peripheral surface of a rotating drum cathode; the electrodeposited copper is continuously peeled off the peripheral surface to form the electrodeposited copper foil; and the above-described rust proofing layer and silane coupling agent adsorbed layer is appropriately formed the shiny side of the electrodeposited copper foil.

As described above, since the shiny side of the electrodeposited copper foil becomes the replica of the peripheral surface of a rotating drum cathode, polishing is performed until the surface roughness becomes 0.05 to 1.5 μm (Rz). By appropriately forming a nickel-zinc alloy layer, a chromate layer, and a silane coupling agent adsorbed layer on the shiny side of the electrodeposited copper foil obtained from the rotating drum cathode subjected to such polishing treatment, the copper foil for the flexible for the printed wiring board of the present invention can be manufactured. In this case, polishing the surface of the rotating drum cathode will easily produce polishing streaks along the circumferential direction thereof, and it is desired to allow as few polishing streaks as possible to be produced. This is because if the polishing streaks outstand, the specular gloss of the shiny side may be lowered in the obtained electrodeposited copper foil even if the surface roughness value of the peripheral surface is 0.05 to 1.5 μm (Rz). In other words, this is because specular gloss values tend to differ between the length direction (MD direction) and the drum width direction (TD direction) in the obtained electrodeposited copper foil.

BEST MODE FOR CARRYING OUT THE INVENTION

Preferred embodiments of the present invention will be described below.

First Embodiment

Figure 1:
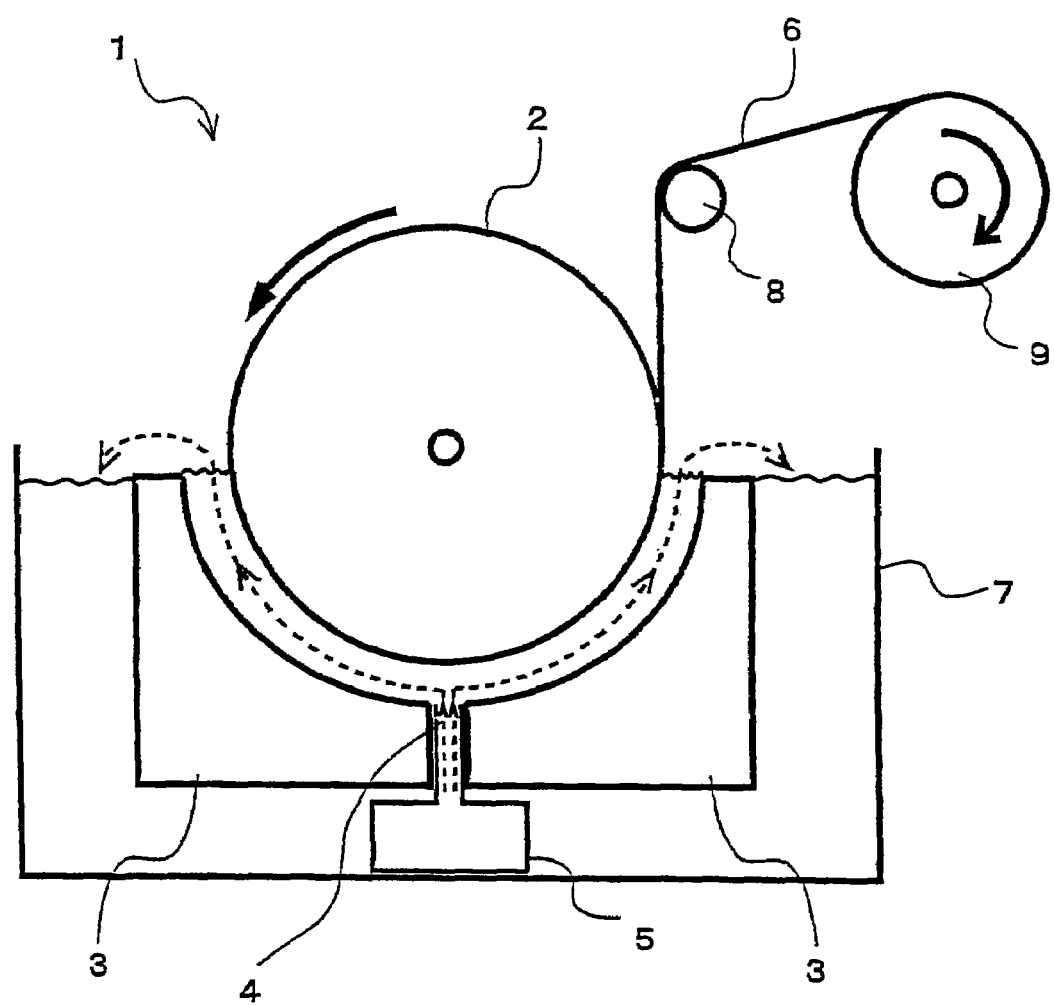
FIG. 1 is a partially enlarged perspective view of a metal foil electrodepositing apparatus.

First, in the first embodiment, the manufacture of an electrodeposited copper foil used in the flexible printed wiring board of the present invention will be described. The electrodeposited copper foil is manufactured with electrodeposited copper foil manufacturing equipment using a conventionally known rotating drum cathode, and the schematic sectional view is shown in FIG. 1. The electrodeposited copper foil manufacturing equipment 1 is equipped with a rotating drum cathode 2 made of titanium (diameter: 3 m; width: 1.35 m) for electrodepositing copper, and an insoluble anode 3 known as DSA placed opposite along the peripheral surface shape of the rotating cathode 2. The rotating cathode 2 and the anode 3 are connected to a power supply unit (not shown). The rotating drum cathode 2 is designed so that a substantially half of the volume is immersed in an electrolyte solution; the anode 3 is divided into two portions, and an electrolyte supply means 5 having an electrolyte supply port 4 for supplying an electrolyte from the bottom of the rotating cathode 2 is installed between the divided portions of the anode 3. When a copper sulfate electrolyte solution is supplied from the electrolyte supply port 4 toward the rotating cathode 2, as the broken lines in FIG. 1 show, the electrolyte solution flows upwardly along the peripheral surface shape of the rotating cathode 2, and overflows into an electrolysis vessel 7. The copper foil 6 deposited on the peripheral surface of the rotating cathode 2 is pealed from the rotating cathode. 2, and is wound around a take-up roll 9 past a guide roll 8. Table 1 shows the manufacturing conditions of the electrodeposited copper foil.

TABLE 1

| Copper concentration | | 82 g/L |
|---|---|---|
| Sulfuric acid concentration | Total | 300 g/L |
| Current density | | 50 DK |
| Electrolyte temperature | | 50° C. |
| Chlorine concentration | | 2 ppm |

The peripheral surface of the rotating drum cathode made of titanium was subjected to polishing treatment using PVA (polyvinyl acetal) grind stone, and after mounting on the above-described electrodeposited copper foil manufacturing equipment, the peripheral surface was subjected to buffing treatment using a #2500 buff using aluminum oxide as an abrasive coating so that the surface roughness of the peripheral surface became within a range between Rz 0.05 and 1.5 μm. Thereafter the electrodeposited copper foil was manufactured under the conditions shown in Table 1. The electrodeposited copper foil used in this embodiment was the one called the VLP type (very low profile type, surface roughness of the matte side: Rz 1.5 to 5.0 μm), and was manufactured to have a thickness of 12 μm.

Three lots of electrodeposited copper foils were prepared as described above; the shiny side thereof was subjected to rust-proofing consisting of nickel-zinc alloy plating treatment, chromate treatment and silane coupling agent treatment in this order; and the electrodeposited copper foils for flexible printed wiring boards of this embodiment were manufactured. The surface treatments were conducted under the conditions as shown in Table 2. These treatments were performed using s surface treating machine known to the art (not shown) that rewinds the rolled electrodeposited copper foil from a direction, performs each surface treatment on the copper foils sequentially guided to each treatment vessel by guide rolls, and finally performs a drying treatment and takes up the copper foils as rolls.

TABLE 2

| Acid pickling pretreatment | Sulfuric acid 100 g/L | | |
|---|---|---|---|
| Nickel-zinc alloy plating | Pyrophosphoric acid bath Composition: | Ni Zn | 0.3 g/L 2.5 g/L 40° C. |

TABLE 2-continued

| Electrolytic chromate treatment | Chromic acid | 1.0 g/L |
|---|---|---|
| Silane coupling agent treatment | γ-aminopropyltrimethoxysilane | 5.0 g/L |

For the three lots of the electrodeposited copper foils, surface treatment was performed on the shiny side thereof under the conditions shown in Table 2 to fabricate three lots of electrodeposited copper foils for flexible printed wiring boards (Examples 1 to 3). For comparison, two lots of buff-polished copper foils proposed by the present applicant for ultra-fine patterns were also prepared (Comparative Examples 1 and 2). The buff-polished copper foil is a copper foil manufactured by physically polishing the matte side of an electrodeposited copper foil to clear away the irregularity on the matte side, and performing nodular treatment, rust-proofing treatment (nickel-zinc plating and chromate treatment) and silane coupling agent treatment onto the buff-polished matte side thereof (for details, refer to Japanese Patent Laid-Open No. 9-195096). The buff-polished copper foils of the Comparative Examples have been developed for applying to ultra-fine patterns, and have been used as copper foils suitable to applications such as rigid printed wiring boards and TAB tapes. The electrodeposited copper foils used in the Comparative Examples were of a VLP type manufactured under the above-described electrolysis conditions (except for the surface roughness of the peripheral surface of the rotating drum cathode), and had a thickness of 15 μm after buff finishing.

For Examples 1 to 3 and Comparative Examples 1 and 2, the results of measuring the surface roughness of the adhering surface side thereof, and each quantity per unit area of rust proofing treatment will be described. The surface roughness was calculated in accordance with JIS B 0601, as the ten-point-average roughness (Rz). The quantity per unit area of rust proofing treatment was measured by cutting a sample of a predetermined area, preparing solutions by dissolving the surface of the sample, and obtaining the concentration of Ni, Zn and the like in the solution by measuring the absorption of light of the solution with ICP to calculate each quantity per unit area. Table 3 shows the results of measurements.

Here, the results of measuring the specular gloss of the adhering surface side, and the optical transmittance of each copper foil will be described. The specular gloss was measured using a Handy Gloss meter PG-1M (manufactured by Nippon Denshoku Industries Co., Ltd.), and the values when the incident angles were 60° and 20° were adopted. The optical transmittance was measured using an absorptiometer, by applying a commercially available polyimide varnish (Rikacoat SN-20 manufactured by New Japan Chemical Co., Ltd.) to each copper foil and heated to form a laminated film formed by laminating polyimide insulating layers of a thickness of 40 μm, partially removing the copper foil by etching the laminated film, and radiating light to the removed area. The measuring wavelengths were 400 to 800 nm, and the optical transmittance when the wavelength was 600 nm was adopted as the representative value. The results are shown in Table 3.

The specular gloss was measured along two directions of the electrodeposited copper foil produced: the direction corresponding to the circumferential direction of the rotating drum cathode (MD), and the direction corresponding to the width direction of the rotating drum cathode (TD). As a result, the adhering surfaces of Examples 1 to 3 were confirmed to have very high specular gloss values, and it was found that the optical transmittance was 50% or more, accordingly. On the other hand, the specular gloss of comparative example 1 or 2 was a very small value because the nodular treatment has been performed. In addition, the optical transmittance was lower than 50%, and the optical transmittance considered to be required for alignment could not be obtained. Here, for reference, the results of measuring the specular gloss on the non-adhering surface of Comparative Examples 1 and 2 are shown in Table 4.

TABLE 4

| | Non-adhering surface (specular gloss) | | | | Non-adhering surface Roughness |
|---|---|---|---|---|---|
| | Incident angle 60° | | Incident angle 20° | | |
| | MD | TD | MD | TD | Rz |
| Comparative Example 1 | 71 | 59 | 19 | 17 | 1.7 |
| Comparative Example 2 | 85 | 67 | 20 | 18 | 1.5 |

The non-adhering surface of Comparative Examples 1 and 2 shown in Table 4 corresponds to the shiny side of an electrodeposited copper foil, and in the case of the electrodeposited copper foils of the Comparative Examples, the surface roughness of the peripheral surface of the rotating cathode on the manufacture of the electrodeposited copper foils was about 1.5 to 2.0 μm, and some polishing streaks

TABLE 3

| | Adhering surface | | | | Specular gloss | | | | |
|---|---|---|---|---|---|---|---|---|---|
| | Roughness | Ni | Zn | Cr | Incident angle 60° | | Incident angle 20° | | Optical |
| | Rz | quantity | quantity | quantity | MD | TD | MD | TD | transmittance % |
| Example 1 | 0.70 | 23 | 9 | 0.5 | 374 | 304 | 220 | 160 | 72 |
| Example 2 | 0.59 | 25 | 10 | 0.5 | 404 | 337 | 330 | 230 | 65 |
| Example 3 | 0.81 | 26 | 11 | 0.6 | 438 | 360 | 290 | 260 | 80 |
| Comparative Example 1 | 1.40 | 16 | 13 | 4.0 | 1.5 | 12.5 | 1.0 | 0.8 | 22 |
| Comparative Example 2 | 1.80 | 18 | 15 | 4.0 | 1.0 | 5.0 | 1.4 | 0.9 | 35 |

(Unit of Ni, Zn and Cr quantities: g/m$^2$)

were observed. Although the decisive reason why the specular gloss of Comparative Examples became so small values was unknown, it was estimated that the specular gloss did not necessarily increase even if the surface roughness value was simply small.

Figure 2:
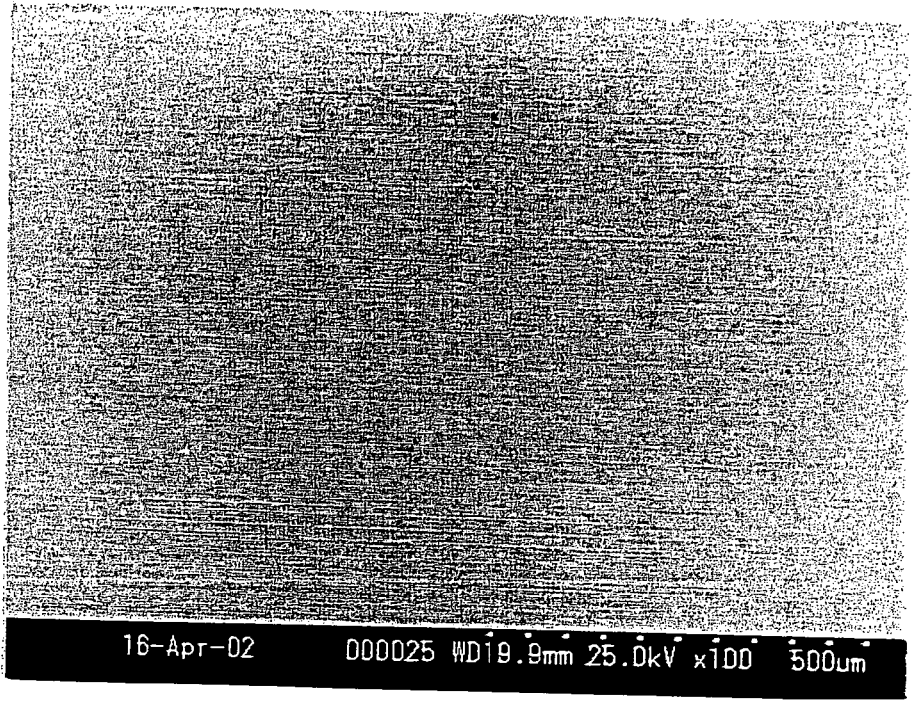
FIG. 2 is photographs of the adhering surface of the copper foil of Example 1 observed using an SEM.
Figure 2:
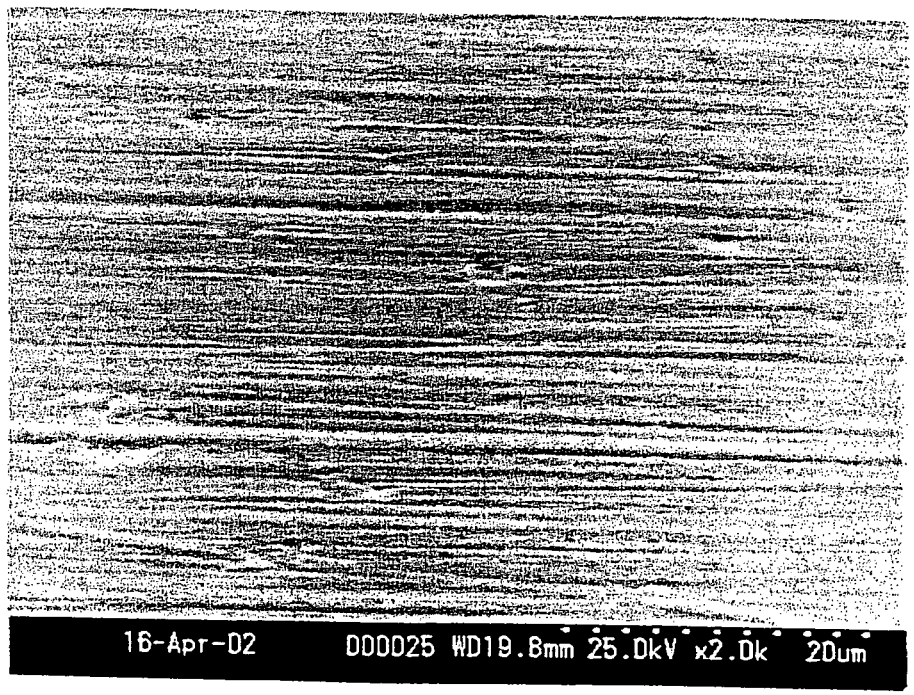

Next, the results of observing the adhering surface of the electrodeposited copper foil for flexible printed wiring boards according to the first embodiment will be described. FIG. 2 shows photographs of the adhering surface of the copper foil of Example 1 observed using an SEM. FIG. 2(a) is a photograph of a magnification of 100; and (b) is a photograph of a magnification of 2,000. As seen from these photographs, the adhering surface is very flat, and polishing streaks are very small.

Figure 3:
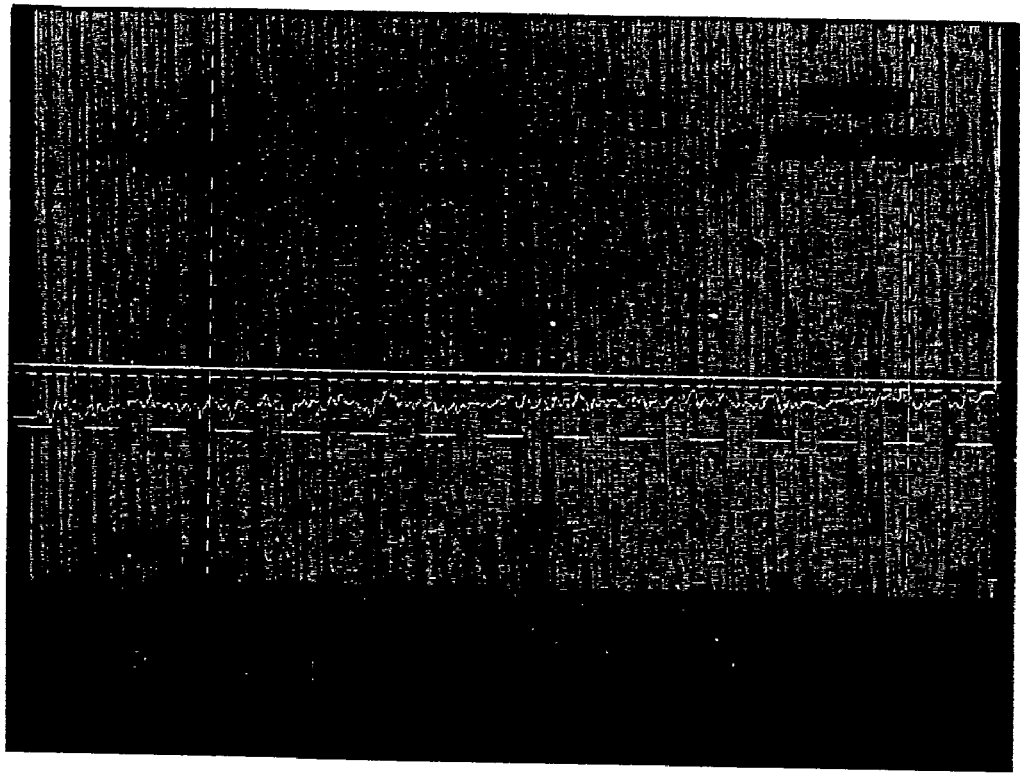
FIG. 3 is a photograph showing the result of the laser microscope observation of the adhering surface of the copper foil of Example 1.

FIG. 3 shows a profile obtained by scanning the adhering surface of the copper foil of Example 1 with a laser microscope. In FIG. 3, what white lines show is the profile (×800) of the adhering surface obtained by laser scanning in the TD direction of the copper foil. As seen from this, the adhering surface of Example 1 was confirmed that the surface roughness value was small, and the irregularity was very small and became nearly uniform.

Second Embodiment

In the second embodiment, the results of examinations about the specular gloss and the optical transmittance of the adhering surface of an electrodeposited copper foil characterized by the types and the surface treatment thereof, particularly with or without nodular treatment, will be described. Table 5 shows various electrodeposited copper foils, and the results of the specular gloss and the optical transmittance thereof.

polished using PVA grindstone, and the cathode drum was mounted on the above-described electrodeposited foil manufacturing equipment, the peripheral surface was buff-polished with a #1500 buff using aluminum oxide as the abrasive coating until the surface roughness of the peripheral surface turned within a range between Rz 1.6 and 1.8 μm, and manufactured under the electrolysis conditions described in Table 1. The low-roughness foil subjected to nodular treatment on the matte side is Comparative Example A-2; and the ones subjected to nodular treatment on the shiny sides are Comparative Examples A-3 and A-4. Here, the nodular treatment for A-1 to A-3 were performed under ordinary treatment conditions wherein after performing burnt plating, seal plating was performed as described below:

| 1. | Conditions of burnt plating treatment | | |
|---|---|---|---|
| | Copper sulfate (copper concentration) | | 10 g/L |
| | Sulfuric acid | | 170 g/L |
| | Liquid temperature | | 50° C. |
| | Treating time | | 2 seconds |
| 2. | Conditions of seal plating treatment | | |
| | Copper sulfate (copper concentration) | A-1 | 50 g/L |
| | | A-2 | 140 g/L |
| | | A-3 | 50 g/L |
| | Sulfuric acid | | 170 g/L |
| | Liquid temperature | | 50° C. |
| | Treating time | | 2 seconds |

The nodular treatment for A-4 was performed by performing burnt plating treatment using a burnt plating solu-

TABLE 5

| | | Adhering surface | | Specular gloss | | |
| | | | | Incident angle 60° | | |
| | Conductive layer | Roughened treatment | Roughness Rz μm | MD | TD | Optical transmittance % |
|---|---|---|---|---|---|---|
| Comparative Example A-1 | Normal foil matte surface | Yes | 4.5 | 1.3 | 1.1 | 1.1 |
| Comparative Example A-2 | Matte side of low-roughness foil | Yes | 3.5 | 1.0 | 1.0 | 0.8 |
| Comparative Example A-3 | Shiny side of low-roughness foil | Yes | 2.6 | 0.1 | 0.2 | 3.7 |
| Comparative Example A-4 | Shiny side of low-roughness foil | Yes | 1.7 | 0.3 | 0.8 | 31.3 |
| Comparative Example A-5 | Shiny side of low-roughness foil | No | 1.6 | 74.8 | 100.6 | 44.9 |
| Comparative Example A-6 | Vacuum-deposited + copper-plated foil | No | — | — | — | 75.0 |
| Example A-1 | Foil of the present embodiment | No | 0.8 | 376.0 | 318.0 | 76.3 |

Table 5 lists samples used for comparison as Comparative Examples A-1 to 6. Specifically, the normal foil of Comparative Example A-1 means electrodeposited foil that falls under Grade III of JIS for copper foils having an irregular matte side whose convex portions have been subjected to nodular treatment of tiny copper particles (thickness: 18 μm). The low-roughness foil of Comparative Example A-2 means an electrodeposited foil referred to the VLP type (very low profile type, surface roughness of matte side Rz: 1.5 to 5.0 μm) described in the first embodiment (thickness: 12 μm). However, the low-roughness foil used here was manufactured through a sequence of steps where the peripheral surface of a rotating drum cathode made of titanium was tion containing 1 g/L of arsenic (As) as an additive (other conditions were same as the above treatment conditions), and then performing seal plating using the same concentration of a seal plating solution as in Comparative Example A-1 (other conditions were same as the above treatment conditions). By this nodular treatment for A-4, copper particles (0.1 to 1 μm), finer than copper particles (1 to 2 μm) formed under ordinary nodular treatment conditions, were electrodeposited as nodules.

Comparative Example A-5 was a low-roughness foil subjected to rust proofing treatment without performing nodular treatment on the shiny side of the low-roughness foil. Comparative Example A-6 was made by a method known as direct metallization, wherein a Cr—Ni film (70 angstroms) was formed by vapor deposition on a side of a polyimide film (Toray-DuPont Co., Ltd., Capton E N, thickness: 38 μm), and the vapor-deposited film was subjected to copper plating treatment to form copper as a conductive layer (8 μm). Furthermore, Example A-1 was Example 3 used in the above-described first embodiment. In addition, the rust proofing treatment for Comparative Examples A-1 to 5 was the same as the treatment for Example A-1 shown in Table 3. The optical transmittance of Comparative Examples A-1 to 5 and Example A-1 was measured by applying a commercially available polyimide varnish (Rikacoat SN-20 manufactured by New Japan Chemical Co., Ltd.) to each copper foil and heated to produce a laminated film formed by laminating a polyimide layer 40 μm thick as in the first embodiment. Since the measurement of surface roughness and optical transmittance was the same as in the above-described first embodiment, the description thereof will be omitted.

As seen from Table 5, the samples subjected to nodular treatment on the adhering surfaces had large surface roughness values, and small specular gloss values (incident angle: 60°); accordingly, the optical transmittance was very low. In addition, even when the shiny side not subjected to nodular treatment was used as the adhering surface, if the surface roughness value became 1.6 μm, the specular gloss value at an incident angle of 60° was not so large, and as a result, the optical transmittance was not a practically satisfactory level. On the other hand, in the case of Comparative Example A-6 prepared using the direct metallization method, since copper-plating treatment was performed on the vapor-deposited film, the result of the measurement of optical transmittance was naturally high. In the case of Example A-1, the surface roughness was as small as 0.8 μm, and the specular gloss (incident angle: 60°) was 300 or more; accordingly, it was known that the optical transmittance was high.

Third Embodiment

Finally, concerning the rust proofing treatment on the adhering surface of electrodeposited copper foils, the results of examining the adhesion and migration resistance when flexible printed wiring boards were constituted will be described.

Adhesion study in the third embodiment was conducted using the electrodeposited copper foil prepared in the same manner as in Example 3 of the above-described first embodiment, whereto each rust proofing treatment shown in Table 6 was performed.

TABLE 6

| | Surface treatment of adhering surface | | | | Evaluation | | | |
|---|---|---|---|---|---|---|---|---|
| | Rust proofing treatment | | | | Pealing strength | | | |
| | | Adhering | | | (kgf/cm) | | | |
| | | quantity | Silane coupling agent | | In normal | After | | Optical |
| | Kind | mg/m² | Type | Concentration | state | heating | Blackening | transmittance (%) |
| Comparative Example B-1 | Zn | 36.3 | a | 5 | 0.38 | 0.27 | Good | 73.1 |
| Comparative Example B-2 | Zn | 36.3 | b | 5 | 0.24 | — | Good | 68.4 |
| Comparative Example B-3 | Zn | 36.3 | c | 5 | 0.00 | — | Good | 69.2 |
| Comparative Example B-4 | Zn | 36.3 | d | 5 | 0.10 | — | Good | 71.5 |
| Comparative Example B-5 | Zn | 36.3 | e | 5 | 0.41 | 0.24 | Good | 70.3 |
| Comparative Example B-6 | Sn | 33.0 | a | 5 | 0.44 | 0.68 | No good | 51.5 |
| Comparative Example B-7 | Sn | 38.3 | e | 5 | 0.49 | 0.68 | No good | 48.7 |
| Comparative Example B-8 | Ni | 123.0 | a | 5 | 0.50 | 0.76 | No good | 46.3 |
| Comparative Example B-9 | Ni | 118.8 | e | 5 | 0.52 | 0.65 | No good | 52.2 |
| Comparative Example B-10 | Co | 117.6 | a | 5 | 0.56 | 0.70 | Good | 69.9 |
| Comparative Example B-11 | Co | 108.2 | e | 5 | 0.48 | 0.59 | Good | 69.5 |
| Comparative Example B-12 | Zn, Ni | 16.1 6.9 | a | 5 | 0.68 | 0.23 | Good | 71.9 |
| Comparative Example B-13 | Zn Ni Co | 2.6 19.4 110.0 | a | 5 | 0.36 | 0.58 | Good | 68.0 |
| Comparative Example B-14 | Zn Ni Co | 2.6 19.4 109.2 | e | 5 | 0.51 | 0.50 | Good | 68.2 |
| Example B-1 | Zn Ni | 13.2 5.8 | e | 5 | 1.50 | 1.03 | Good | 73.3 | a: γ-Glycidoxypropyltrimethoxysilane
b: γ-Methacryloxypropyltrimethoxysilane
c: γ-Acryloxypropyltrimethoxysilane
d: γ-Chloropropyltrimethoxysilane
e: γ-Aminopropyltrimethoxysilane As Table 6 shows, various rust proofing treatments were performed on the electrodeposited copper foil of Example 3, and after electrolytic chromate treatment (using 1.0 g/L chromic acid solution), five types of silane coupling agent treatment of a to e in Table 6 were performed, respectively. The conditions for rust proofing treatment were as follows:

Conditions of rust proofing treatment of Comparative Examples B-1 to 5 (treated in the following order)

| 1. | Zinc (Zn) rust proofing treatment | |
|---|---|---|
| | Zn concentration | 6.0 g/L |
| | Potassium pyrophosphate | 140 g/L |
| | pH | 10.5 |
| | Liquid temperature | 40° C. |
| | Current density | 1.25 A/dm$^2$ |
| | Treating time | 12 seconds |
| 2. | Water washing treatment | |
| 3. | Electrolytic chromate treatment | |
| | CrO$_3$ concentration | 1.0 g/L |
| | pH | 12.0 |
| | Liquid temperature | 25° C. |
| | Current density | 1.25 A/dm$^2$ |
| | Treating time | 12 seconds |
| 4. | Water washing treatment | |
| 5. | Silane coupling agent treatment | |
| 6. | Drying treatment | 150° C. |

Conditions of rust proofing treatment of Comparative Examples B-6 and 7

| Tin (Sn) rust proofing treatment | |
|---|---|
| Sn concentration | 6.0 g/L |
| Potassium pyrophosphate | 100 g/L |
| pH | 10.5 |
| Liquid temperature | 40° C. |
| Current density | 0.75 A/dm$^2$ |
| Treating time | 12 seconds |

After this Sn rust proofing treatment, treatments on and after No. 2 of the above-described B-1 to 5 were performed.

Conditions of rust proofing treatment of Comparative Examples B-8 and 9

| Nickel (Ni) rust proofing treatment | |
|---|---|
| Ni concentration | 6.0 g/L |
| Potassium pyrophosphate | 100 g/L |
| pH | 10.5 |
| Liquid temperature | 40° C. |
| Current density | 0.5 A/dm$^2$ |
| Treating time | 12 seconds |

After this Ni rust proofing treatment, treatments on and after No. 2 of the above-described B-1 to 5 were performed.

Conditions of rust proofing treatment of Comparative Examples B-10 and 11

| Cobalt (Co) rust proofing treatment | |
|---|---|
| Co concentration | 3.0 g/L |
| Potassium pyrophosphate | 100 g/L |
| pH | 10.5 |
| Liquid temperature | 40° C. |
| Current density | 0.5 A/dm$^2$ |
| Treating time | 12 seconds |

After this Co rust proofing treatment, treatments on and after No. 2 of the above-described B-1 to 5 were performed.

Conditions of rust proofing treatment of Comparative Examples B-13 and 14

Zinc (Zn)-nickel (Ni)-cobalt (Co) ternary system rust proofing treatment

| Zn concentration | 0.25 g/L |
|---|---|
| Ni concentration | 3.0 g/L |
| Co concentration | 4.0 g/L |
| Potassium pyrophosphate | 100 g/L |
| pH | 10.5 |
| Liquid temperature | 40° C. |
| Current density | 0.5 A/dm$^2$ |
| Treating time | 12 seconds |

After this Zn—Ni—Co ternary rust proofing treatment, treatments on and after No. 2 of the above-described B-1 to 5 were performed.

The conditions of rust proofing treatment of Comparative Example B-12 and Example B-1 were the same as conditions in Table 2 of the above-described first embodiment. The silane coupling treatment was performed by preparing solutions of various silane coupling agents of a to e (5 g/L). The surface roughness of the adhering surfaces of all the electrodeposited copper foils, which were surface-treated as in Table 6, was 0.8 μm in Rz.

The evaluation of adhesion was performed after the above-described surface treatment, by applying a commercially available polyimide varnish (Rikacoat SN-20 manufactured by New Japan Chemical Co., Ltd.) to each electrodeposited copper foil and heated to form a laminated film formed by laminating polyimide layers (insulating layers) of a thickness of 40 μm, and by measuring each peel strength. The measurement of peel strength was performed in accordance with JIS-C-6481 for the normal state and after heat treatment at 150° C. for 50 hours. Blackening evaluation was performed by observing the surface state of the insulating layer that has emerged by alkali etching of the conductive layer using an A Process vat solution (manufactured by Meltex Inc.). Since the optical transmittance was measured in the same method as described above, the description thereof will be omitted.

As Table 6 shows, it was known that Example B-1 had a very high peel strength, and had no practical problems. When Zn, Sn, Ni, or Co was used alone for rust proofing treatment, or when the Zn—Ni—Co ternary rust proofing treatment was performed, it was found that a lower peel strength was exhibited than a peel strength after the Zn—Ni binary rust proofing treatment even when the same silane coupling agent was used. Furthermore, it was confirmed that amino functional silane of the silane coupling agent c tended to elevate peel strength compared to other silane coupling agents (a, b, d, and e). Attainment of a higher peel strength by this amino functional silane suggests, from the structural formulas of respective silane coupling agents, that the relative bulkiness of silane chain in each structural formula may be involved.

INDUSTRIAL APPLICATION

According to the flexible printed wiring board of the present invention, as described above, since the optical transmittance of the insulating layer constituting the flexible printed wiring board becomes 50% or more, the alignment when ICs are mounted can be performed accurately, and not only the adhesion of the conductive layer and the insulating layer is satisfactory, but also migration resistant characteristics become highly excellent. Furthermore, since no nodular treatment is performed on the electrodeposited copper foil that forms the conductive layer, a flexible printed wiring board for fine-pitch COF can easily be formed.

What is claimed is:

1. A flexible printed wiring board for a chip on film (hereafter referred to as COF), comprising an insulating layer and an etched conductive layer, the conductive layer comprising an electrodeposited copper foil having an adhering surface to which a rust-proofing layer is adhered, the rust-proofing layer located between the insulating layer and the conductive layer and comprising a nickel-zinc alloy, wherein the insulating layer has an optical transmittance of 50% or more in regions where the conductive layer is etched, and wherein the surface roughness (Rz) of the adhering surface is 0.05 to 1.5 μm, and the adhering surface has a specular gloss of 250 or more when the incident angle is 60°.

2. The flexible printed wiring board for COF according to claim 1, wherein the nickel-zinc alloy consists of 99 to 50 wt % nickel and 1 to 50 wt % zinc.

3. The flexible printed wiring board for COF according to claim 1, wherein the rust-proofing layer is a nickel-zinc alloy layer having a chromate layer formed thereon and a silane coupling agent adsorbed layer whereon an amino functional silane coupling agent is adsorbed is formed on the surface of said rust-proofing layer.

4. The flexible printed wiring board for COF according to claim 1, wherein the adhering surface of the electrodeposited copper foil is a glossy surface.

* * * * *